United States Patent
Qiao et al.

(10) Patent No.: US 11,044,046 B2
(45) Date of Patent: Jun. 22, 2021

(54) DATA PROCESSING METHOD AND APPARATUS

(71) Applicant: HUAWEI TECHNOLOGIES CO., LTD., Shenzhen (CN)

(72) Inventors: Yunfei Qiao, Hangzhou (CN); Huazi Zhang, Hangzhou (CN); Yinggang Du, Shenzhen (CN); Gongzheng Zhang, Hangzhou (CN); Guijie Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 39 days.

(21) Appl. No.: 16/529,821

(22) Filed: Aug. 2, 2019

(65) Prior Publication Data

US 2019/0363826 A1  Nov. 28, 2019

Related U.S. Application Data

(63) Continuation of application No. PCT/CN2018/075129, filed on Feb. 2, 2018.

(30) Foreign Application Priority Data

Feb. 3, 2017  (CN) .......................... 201710063715.5

(51) Int. Cl.
*H04L 1/00* (2006.01)
*H03M 13/11* (2006.01)
*H03M 13/13* (2006.01)

(52) U.S. Cl.
CPC ....... *H04L 1/0057* (2013.01); *H03M 13/1125* (2013.01); *H03M 13/13* (2013.01); *H04L 1/0041* (2013.01); *H04L 1/0061* (2013.01)

(58) Field of Classification Search
CPC ..... H04L 1/007; H04L 1/0041; H04L 1/0045; H04L 1/0057; H04L 1/0061; H03M 13/13; H03M 13/1125
See application file for complete search history.

(56) References Cited

U.S. PATENT DOCUMENTS 9,917,675 B2 * 3/2018 Kudekar ............... H04L 1/0045
2013/0117344 A1 * 5/2013 Gross ................ H03M 13/1575
708/490

(Continued)

FOREIGN PATENT DOCUMENTS

CN  102164025 A  8/2011
CN  103220001 A  7/2013

(Continued)

OTHER PUBLICATIONS

Song et al., Low complexity segmented CRC-aided SC stack decoder for polar codes, IEEE, pp. 1189-1193. (Year: 2016).*

(Continued)

*Primary Examiner* — Shelly A Chase
(74) *Attorney, Agent, or Firm* — Kilpatrick Townsend & Stockton LLP

(57) ABSTRACT

Embodiments of the present invention disclose a data processing method. The method includes: receiving, by an encoder, a to-be-encoded information block; encoding, by the encoder, the information block in a PC-Polar encoding when a channel coding parameter is in one value range, and/or encoding, by the encoder, the information block in a CA-Polar encoding when the channel coding parameter is in another value range; and outputting, by the encoder, a result of the encoding the information block.

31 Claims, 10 Drawing Sheets

(56) References Cited

U.S. PATENT DOCUMENTS

2014/0365842 A1    12/2014  Li et al.
2015/0381208 A1    12/2015  Li et al.
2016/0013810 A1*    1/2016  Gross .................... H03M 13/13
                                                                714/776
2016/0294418 A1    10/2016  Huang et al.

FOREIGN PATENT DOCUMENTS

| CN | 103516476 A | 1/2014 | |
|---|---|---|---|
| CN | 104038234 A | 9/2014 | |
| CN | 104124979 A | 10/2014 | |
| WO | 2015180187 A1 | 12/2015 | |
| WO | WO-2018130892 A1 * | 7/2018 | ........... H04L 1/0071 |

OTHER PUBLICATIONS

Yu et al., Hybrid parity-check and CRC-aided SCL decoding for polar codes, IEEE, pp. 711-716. (Year: 2016).*
Niu et al., CRC_aided decoding of polar codes, IEEE, Communication Letters, vol. 16, No. 10, pp. 1668-1671. (Year: 2012).*
Intel Corp.: "Polar code design", 3GPP draft R1-1700386, RAN WG1, Spokane, USA; Spokane, USA, Jan. 16-20, 2017, XP051207923.
Samsung, Discussion on CA-Polar and PC-Polar Codes. 3GPP TSG RAN WG1 Ad-Hoc Spokane, Washington, Jan. 16-20, 2017, R1-1700979, 9 pages.
3GPP TSG RAN WG1 Ad-Hoc Meeting, R1-1700088:"Summary of polar code design for control channels", Huawei, HiSilicon, Spokane, USA, Jan. 16-20, 2017, total 10 pages.

* cited by examiner

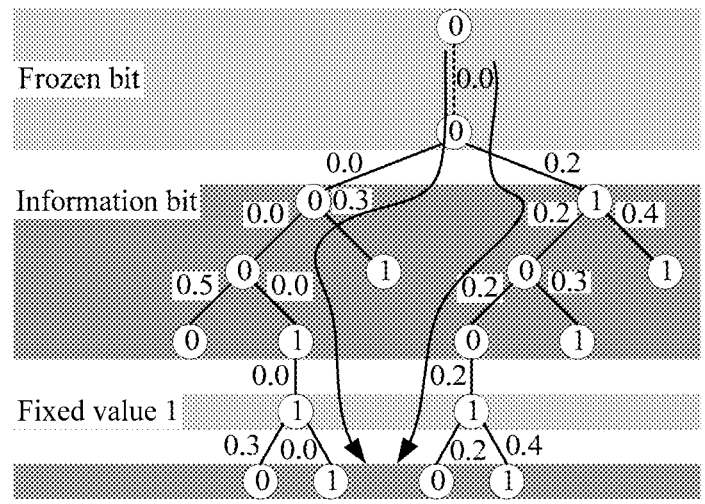
FIG. 1
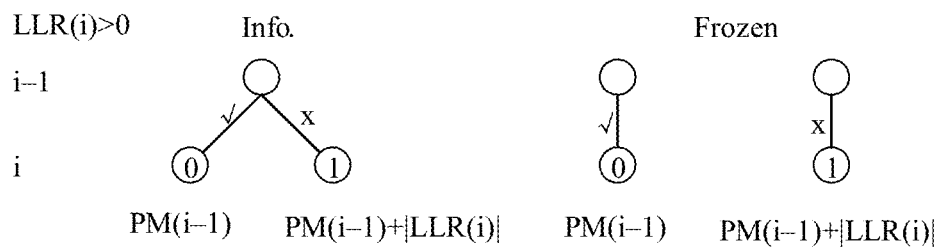
FIG. 2 (a) LLR > 0
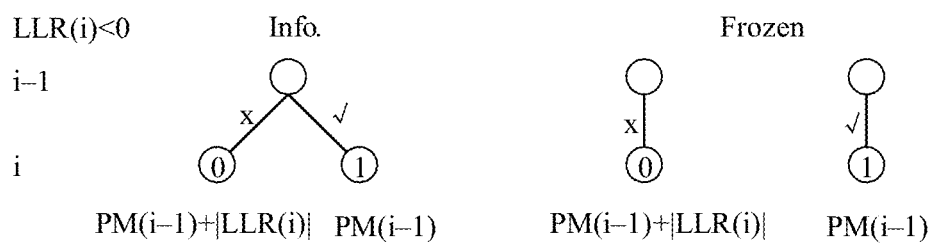
FIG. 2 (b) LLR < 0

DATA PROCESSING METHOD AND APPARATUS

CROSS-REFERENCE TO RELATED APPLICATIONS

This application is a continuation of International Application No. PCT/CN2018/075129, filed on Feb. 2, 2018, which claims priority to Chinese Patent Application No. 201710063715.5, filed on Feb. 3, 2017. The disclosures of the aforementioned applications are hereby incorporated by reference in their entireties.

TECHNICAL FIELD

Embodiments of the present invention relate to the field of electronic and communications technologies, and more specifically, to a data processing method and apparatus.

BACKGROUND

An encoding technology is usually used in a communications system to improve data transmission reliability and ensure communication quality. A polar code (Polar codes) algorithm is a first encoding and decoding algorithm that is theoretically proved to be able to achieve a Shannon capacity and has low encoding and decoding complexity (where both encoding complexity and decoding complexity are O(N log N)).

Currently, there are various Polar code encoding manners, such as a CA-Polar code encoding manner and a PC-Polar code encoding manner. How to select a suitable encoding and/or decoding manner is a problem to be resolved urgently.

SUMMARY

Embodiments of the present invention provide a data processing method and apparatus, and a suitable Polar code encoding and/or decoding manner is selected to improve a comprehensive encoding and/or decoding effect.

According to a first aspect, an embodiment of the present invention provides a first data processing method, where the method includes:

receiving, by an encoder, a to-be-encoded information block;

encoding, by the encoder, the information block in a PC-Polar encoding manner when a channel coding parameter is in one value range, and/or encoding, by the encoder, the information block in a CA-Polar encoding manner when the channel coding parameter is in another value range; and outputting, by the encoder, a result of the encoding the information block.

According to the first data processing method provided in this embodiment of the present invention, different encoding manners are selected based on different ranges of the channel coding parameter, so as to exploit an advantage of each encoding manner by combining features of the encoding manners, thereby improving a comprehensive encoding effect, for example, obtaining a system throughput gain.

In a first possible implementation of the first aspect, the encoding, by the encoder, the information block in a PC-Polar encoding manner when a channel coding parameter is in one value range includes:

encoding, by the encoder, the information block in the PC-Polar encoding manner when channel coding parameters make true $K/M<1/6$ or a channel coding parameter $K>48$, where M indicates a code length, and K indicates an information bit length of the information block.

With reference to the first aspect or the foregoing possible implementation of the first aspect, in a second possible implementation, the encoding, by the encoder, the information block in a CA-Polar encoding manner when the channel coding parameter is in another value range includes:

encoding, by the encoder, the information block in the CA-Polar encoding manner when channel coding parameters make true $K/M>1/12$ or a channel coding parameter $K<120$, where M indicates a code length, and K indicates an information bit length of the information block.

According to a second aspect, an embodiment of the present invention provides a second data processing method, where the method includes:

receiving, by an encoder, a to-be-encoded information block;

encoding, by the encoder, the information block in a PC-Polar encoding manner according to an instruction of first instruction signaling, where the first instruction signaling is used to instruct to encode the information block in the PC-Polar encoding manner; and outputting, by the encoder, a result of the encoding the information block.

In a first possible implementation of the second aspect, the first instruction signaling is carried on a physical channel such as a broadcast channel or a control channel.

According to a third aspect, an embodiment of the present invention provides a third data processing method, where the method includes:

receiving, by an encoder, a to-be-encoded information block;

encoding, by the encoder, the information block in a CA-Polar encoding manner according to an instruction of second instruction signaling, where the second instruction signaling is used to instruct to encode the information block in the CA-Polar encoding manner; and outputting, by the encoder, a result of the encoding the information block.

In a first possible implementation of the third aspect, the second instruction signaling is carried on a physical channel such as a broadcast channel or a control channel.

According to a fourth aspect, an embodiment of the present invention provides a fourth data processing method, where the method includes:

receiving, by a decoder, a to-be-decoded data block;

decoding, by the decoder, the data block in a PC-Polar decoding manner when a channel coding parameter is in one value range, and/or decoding, by the decoder, the data block in a CA-Polar decoding manner when the channel coding parameter is in another value range; and outputting, by the decoder, a result of the decoding the data block.

According to the fourth data processing method provided in this embodiment of the present invention, different decoding manners are selected based on ranges of the channel coding parameter, so as to exploit an advantage of each decoding manner by combining features of the decoding manners, thereby improving a comprehensive decoding effect, for example, obtaining a system throughput gain.

In a first possible implementation of the fourth aspect, the decoding, by the decoder, the data block in a PC-Polar decoding manner when a channel coding parameter is in one value range includes:

decoding the data block in the PC-Polar decoding manner when channel coding parameters make true $K/M<1/6$ or a channel coding parameter $K>48$, where M indicates a code length for encoding the data block, and K indicates an information bit length of the data block before being encoded.

With reference to the fourth aspect or the foregoing possible implementation of the fourth aspect, in a second possible implementation, the decoding, by the decoder, the data block in a CA-Polar decoding manner when the channel coding parameter is in another value range includes: decoding the data block in the CA-Polar decoding manner when channel coding parameters make true K/M>1/12 or a channel coding parameter K<120, where M indicates a code length for encoding the data block, and K indicates an information bit length of the data block before being encoded.

According to a fifth aspect, an embodiment of the present invention provides a fifth data processing method, where the method includes:

receiving, by a decoder, a to-be-decoded data block;

decoding, by the decoder, the data block in a PC-Polar decoding manner according to an instruction of third instruction signaling, where the third instruction signaling is used to instruct to decode the data block in the PC-Polar decoding manner; and outputting, by the decoder, a result of the decoding the data block.

In a first possible implementation of the fifth aspect, the third instruction signaling may be carried on a physical channel such as a broadcast channel or a control channel.

According to a sixth aspect, an embodiment of the present invention provides a sixth data processing method, where the method includes:

receiving, by a decoder, a to-be-decoded data block;

decoding, by the decoder, the data block in a CA-Polar decoding manner according to an instruction of fourth instruction signaling, where the fourth instruction signaling is used to instruct to decode the data block in the CA-Polar decoding manner; and outputting, by the decoder, a result of the decoding the data block.

In a first possible implementation of the sixth aspect, the fourth instruction signaling may be carried on a physical channel such as a broadcast channel or a control channel.

According to a seventh aspect, an embodiment of the present invention provides a seventh data processing method, where the method includes:

encoding, by an encoder, an information block in a PC-Polar encoding manner; and decoding, by a decoder in a CA-Polar decoding manner, a result of the encoding the information block that has been transmitted through a channel.

According to the seventh data processing method provided in this embodiment of the present invention, different decoding manners are selected, so as to exploit an advantage of each decoding manner by combining features of the decoding manners, thereby improving a comprehensive decoding effect, for example, obtaining a system throughput gain.

According to an eighth aspect, an embodiment of the present invention provides an eighth data processing method, where the method includes:

encoding, by an encoder, an information block in a CA-Polar encoding manner; and decoding, by a decoder in a PC-Polar decoding manner, a result of the encoding the information block that has been transmitted through a channel.

According to the eighth data processing method provided in this embodiment of the present invention, different decoding manners are selected, so as to exploit an advantage of each decoding manner by combining features of the decoding manners, thereby improving a comprehensive decoding effect, for example, obtaining a system throughput gain.

With reference to the methods in the foregoing aspects and implementations, in an implementation, the encoding the information block in a CA-Polar encoding manner includes:

generating X1 parity bits based on the information block having a length of K1 and a parity-check equation; concatenating the X1 parity bits to the information block or distributing the X1 parity bits into the information block; and mapping K1+X1 bits comprising the information block and the X1 parity bits to information bits; placing, at a position of a static fixed bit, a fixed value agreed upon by the encoder and the decoder; and then performing Arikan Polar encoding, where the parity-check equation is used to represent a constraint relationship between the information block and the X1 parity bits, and a length of the information block is K1.

With reference to the methods in the foregoing aspects and implementations, in an implementation:

the encoding the information block in a PC-Polar encoding manner includes: generating X2 parity bits based on the information block having a length of K2 and a parity-check equation; distributing the X2 parity bits into the information block; mapping K2+X2 bits comprising the information block and the X2 parity bits to information bits; placing, at a position of a static fixed bit, a fixed value agreed upon by the encoder and the decoder; and then performing Arikan Polar encoding, where the parity-check equation represents a constraint relationship between the information block and the X2 parity bits, and a length of the information block is K2.

With reference to the methods in the foregoing aspects and implementations, in an implementation, the performing, by the decoder, decoding in a CA-Polar decoding manner includes:

obtaining a plurality of candidate results through decoding in a successive cancellation decoding manner and an extended decoding manner thereof, where the candidate result includes the information block and a parity bit; and performing check on the plurality of candidate results by using a parity-check equation, where an information block in a candidate result on which parity check succeeds is the result of the decoding, or when parity check on all the plurality of candidate results fails, an information block in a candidate result of a path with a minimum PM (path-metric) is the result of the decoding.

The performing parity check on the plurality of candidate results by using a parity-check equation may specifically include: performing parity check on the plurality of candidate results by using the parity-check equation in ascending order of PM values, starting from the candidate result of the path with the minimum PM value.

With reference to the methods in the foregoing aspects and implementations, in an implementation, the performing, by the decoder, decoding in a PC-Polar decoding manner includes: selecting a decoding path in a decoding process by using a parity bit and a parity-check equation; and when a value of the parity bit is consistent with an LLR (log likelihood ratio, log-likelihood ratio), using an information block in the selected decoding path as the result of the decoding; or when a value of the parity bit is inconsistent with an LLR (log likelihood ratio, log-likelihood ratio), using an information block in a path with a minimum PM (path-metric) value as the result of the decoding.

With reference to the methods in the foregoing aspects and implementations, in an implementation, the channel coding parameter is a parameter related to channel encoding and/or channel decoding.

With reference to the methods in the foregoing aspects and implementations, in an implementation, the channel coding parameter may specifically include at least one of the following parameters: N, M, K, L, and a derived parameter determined by at least one of N, M, K, and L, where N indicates a mother code length of Polar encoding, M indicates the code length, K indicates the length of the information block, and L indicates a search width in a decoding process.

With reference to the methods in the foregoing aspects and implementations, in an implementation, in a range of K/M<1/6, K/M is any value in the range of K/M<1/6.

With reference to the methods in the foregoing aspects and implementations, in an implementation, in the range of K/M<1/6, K/M<1/12 may be specifically selected.

With reference to the methods in the foregoing aspects and implementations, in an implementation, in a range of K/M>1/12, K/M is any value in the range of K/M>1/12.

With reference to the methods in the foregoing aspects and implementations, in an implementation, in the range of K/M>1/12, K/M>1/6 may be specifically selected.

With reference to the methods in the foregoing aspects and implementations, in an implementation, in a range of K>48, K is any value in the range of K>48.

With reference to the methods in the foregoing aspects and implementations, in an implementation, in the range of K>48, K>64 may be specifically selected.

With reference to the methods in the foregoing aspects and implementations, in an implementation, in a range of K>64, K>80 may be specifically selected.

With reference to the methods in the foregoing aspects and implementations, in an implementation, in a range of K>80, K>120 may be specifically selected.

With reference to the methods in the foregoing aspects and implementations, in an implementation, in a range of K<120, K is any value in the range of K<120.

With reference to the methods in the foregoing aspects and implementations, in an implementation, in the range of K<120, K<80 may be specifically selected.

With reference to the methods in the foregoing aspects and implementations, in an implementation, in a range of K<80, K<64 may be specifically selected.

With reference to the methods in the foregoing aspects and implementations, in an implementation, in a range of K<64, K<48 may be specifically selected.

According to a ninth aspect, an embodiment of the present invention provides a ninth data processing method, where the method includes:

encoding, by an encoder, an information block in a CA-Polar and PC-Polar hybrid encoding manner; and decoding, by a decoder in a CA-Polar and PC-Polar hybrid decoding manner, a result of the encoding the information block that has been transmitted through a channel.

According to the ninth data processing method provided in this embodiment of the present invention, advantages of CA-Polar and PC-Polar are combined, and an encoding and decoding manner of combining the both are used, so that a comprehensive encoding and decoding effect can be improved, for example, a system throughput gain is obtained.

In a first possible implementation of the ninth aspect, an implementation of encoding the information block in a CA-Polar and PC-Polar hybrid encoding manner includes: generating X parity bits based on the information block having a length of K and a first parity-check equation; concatenating the X parity bits to the information block; generating Y parity bits based on a second parity-check equation and K+X bits comprising the information block and the X parity bits; arranging the Y parity bits together with the K+X bits; mapping K+X+Y bits comprising the information block, the X parity bits, and the Y parity bits to information bits; placing, at a position of a static fixed bit, a fixed value agreed upon by the encoder and the decoder; and then performing Arikan Polar encoding, to obtain a Polar encoded block, where the first parity-check equation is used to represent a constraint relationship between an information bit in the information block and the X parity bits, the second parity-check equation is used to represent a constraint relationship between the K+X bits and the Y parity bits, and a length of the information block is K.

With reference to the ninth aspect or the foregoing possible implementation of the ninth aspect, in a second possible implementation, another implementation of the encoding the information block in a CA-Polar and PC-Polar hybrid encoding manner includes: generating X parity bits based on the information block having a length of K and a first parity-check equation; distributing the X parity bits into the information block; generating Y parity bits based on a second parity-check equation and K+X bits comprising the information block and the X parity bits; concatenating the Y parity bits to the K+X bits; mapping K+X+Y bits comprising the information block, the X parity bits, and the Y parity bits to information bits; placing, at a position of a static fixed bit, a fixed value agreed upon by the encoder and the decoder; and then performing Arikan Polar encoding, where the first parity-check equation is used to represent a constraint relationship between an information bit in the information block and the X parity bits, the second parity-check equation is used to represent a constraint relationship between the K+X bits and the Y parity bits, and a length of the information block is K.

With reference to the ninth aspect or the foregoing possible implementations of the ninth aspect, in a third possible implementation, the performing, by a decoder, decoding in a CA-Polar and PC-Polar hybrid decoding manner includes: selecting a decoding path by using the Y parity bits and the second parity-check equation in a decoding path selection manner of a PC-Polar decoding manner, to obtain a plurality of candidate results, where the candidate result includes the information block and the X parity bits; and performing parity check on the plurality of candidate results by using the first parity-check equation, where an information block in a candidate result on which parity check succeeds is a result of the decoding, or when parity check on all the plurality of candidate results fails, an information block in a candidate result of a path with a minimum PM (path-metric) is a result of the decoding.

The performing parity check on the plurality of candidate results by using a first parity-check equation may specifically include: performing parity check on the plurality of candidate results by using the first parity-check equation in ascending order of PM values, starting from the candidate result of the path with the minimum PM value.

With reference to the ninth aspect or the foregoing possible implementations of the ninth aspect, in a fourth possible implementation, before the encoding, by an encoder, an information block in a CA-Polar and PC-Polar hybrid encoding manner, the method further includes: receiving, by the encoder, a value of X and/or a value of Y.

With reference to the ninth aspect or the foregoing possible implementations of the ninth aspect, in a fifth possible implementation, before the encoding, by an encoder, an information block in a CA-Polar and PC-Polar hybrid encoding manner, the method further includes: receiving, by the encoder, an index (index) of X and/or an index of Y, where the index of X is used to obtain a value of X by the encoder based on the index of X, and the index of Y is used to obtain a value of Y by the encoder based on the index of Y.

With reference to the ninth aspect or the foregoing possible implementations of the ninth aspect, in a sixth possible implementation, before the decoding, by a decoder in a CA-Polar and PC-Polar hybrid decoding manner, a result of the encoding the information block that has been transmitted through a channel, the method further includes: receiving, by the decoder, a value of X and/or a value of Y.

With reference to the ninth aspect or the foregoing possible implementations of the ninth aspect, in a seventh possible implementation, before the decoding, by a decoder in a CA-Polar and PC-Polar hybrid decoding manner, a result of the encoding the information block that has been transmitted through a channel, the method further includes: receiving, by the decoder, an index (index) of X and/or an index of Y, where the index of X is used to obtain a value of X by the decoder based on the index of X, and the index of Y is used to obtain a value of Y by the decoder based on the index of Y.

With reference to the ninth aspect or the foregoing possible implementations of the ninth aspect, in an eighth possible implementation, Y is greater than or equal to 0, and less than or equal to a code length.

With reference to the ninth aspect or the foregoing possible implementations of the ninth aspect, in a ninth possible implementation, X is greater than or equal to 0, and less than or equal to 24.

According to a tenth aspect, an embodiment of the present invention provides a first data processing apparatus, where the apparatus includes:

an interface module, configured to receive a to-be-encoded information block; and a first encoding module, configured to encode the information block in a PC-Polar encoding manner when a channel coding parameter is in one value range, and/or encode the information block in a CA-Polar encoding manner when the channel coding parameter is in another value range, where the interface module is further configured to output a result of the encoding the information block.

According to an eleventh aspect, an embodiment of the present invention provides a second data processing apparatus, where the apparatus includes:

a transceiver module, configured to receive a to-be-decoded data block; and a second decoding module, configured to decode the data block in a PC-Polar decoding manner when a channel coding parameter is in one value range, and/or decode the data block in a CA-Polar decoding manner when the channel coding parameter is in another value range, where the transceiver module is further configured to output a result of the decoding the data block.

According to a twelfth aspect, an embodiment of the present invention provides a third data processing apparatus, where the apparatus includes:

a third encoding module, configured to encode an information block in a CA-Polar encoding manner; and a third decoding module, configured to decode, in a PC-Polar decoding manner, a result of the encoding the information block that has been transmitted through a channel.

According to a thirteenth aspect, an embodiment of the present invention provides a fourth data processing apparatus, where the apparatus includes:

a fourth encoding module, configured to encode an information block in a PC-Polar encoding manner; and a fourth decoding module, configured to decode, in a CA-Polar decoding manner, a result of the encoding the information block that has been transmitted through a channel.

According to a fourteenth aspect, an embodiment of the present invention provides a fifth data processing apparatus, where the apparatus includes:

a fifth encoding module, configured to encode an information block in a CA-Polar and PC-Polar hybrid encoding manner; and a fifth decoding module, configured to decode, in a CA-Polar and PC-Polar hybrid decoding manner, a result of the encoding the information block that has been transmitted through a channel.

According to a fifteenth aspect, an embodiment of the present invention provides a communications apparatus. The communications apparatus includes: a processor and a memory having a signal connection to the processor. When the communications apparatus runs, the processor reads and executes an instruction in the memory or runs a hardware logic circuit of the processor, so that the communications apparatus performs the embodiments of any one of the data processing methods in the first to the ninth aspects.

In a first possible implementation of the fifteenth aspect, the memory is configured to store the instruction, and the memory may be independent of the processor, or may be integrated into the processor.

With reference to the fifteenth aspect or the foregoing possible implementations of the fifteenth aspect, in a second possible implementation, the communications apparatus may further include a transceiver, configured to receive and/or send data.

With reference to another aspect of the embodiments of this application further provides a computer readable storage medium, where the computer readable storage medium stores an instruction. When the instruction runs on a computer, the computer performs the methods in the foregoing aspects.

With reference to another aspect of the embodiments of this application further provides a computer program product including an instruction. When the instruction runs on a computer, the computer performs the methods in the foregoing aspects.

DESCRIPTION OF DRAWINGS

FIG. 1 is a schematic diagram of an SCL decoding process according to an embodiment of the present invention;

FIG. 2(a) and FIG. 2(b) are a schematic diagram of two cases of a PM calculation process in an SCL decoding process according to an embodiment of the present invention;

DESCRIPTION OF EMBODIMENTS

Embodiments of the present invention are applicable to all kinds of communications systems, and therefore the description below is not limited to a specific communications system, such as a global system for mobile communications (Global System for Mobile communications, "GSM" for short) system, a code division multiple access (Code Division Multiple Access, "CDMA" for short) system, a wideband code division multiple access (Wideband Code Division Multiple Access, "WCDMA" for short) system, a general packet radio service (General Packet Radio Service, "GPRS" for short), a long term evolution (Long Term Evolution, "LTE" for short) system, an LTE frequency division duplex (Frequency Division Duplex, "FDD" for short) system, an LTE time division duplex (Time Division Duplex, "TDD" for short), a universal mobile telecommunications system (Universal Mobile Telecommunications System, "UMTS" for short), or the like. Any information or data that is encoded and processed by a base station or terminal in the foregoing systems by using conventional Turbo codes and LDPC codes can be encoded by using polar codes in the embodiments.

The base station may be a device configured to communicate with a terminal device. For example, the base station may be a base transceiver station (Base Transceiver Station, BTS) in a GSM system or a CDMA system, may be a NodeB (NodeB, NB) in a WCDMA system, or may be an evolved NodeB (Evolved Node B, eNB or eNodeB) in an LTE system. Alternatively, the base station may be a relay node, an access point, a vehicle-mounted device, a wearable device, a network-side device in a future 5G network, or the like.

A terminal may communicate with one or more core networks by using a radio access network (Radio Access Network, RAN), and the terminal may be user equipment (user equipment, UE), an access terminal, a subscriber unit, a subscriber station, a mobile station, a mobile console, a remote station, a remote terminal, a mobile device, a user terminal, a wireless communications device, a user agent, or a user apparatus. The access terminal may be a cellular phone, a cordless phone, a session initiation protocol (Session Initiation Protocol, SIP) phone, a wireless local loop (Wireless Local Loop, WLL) station, a personal digital assistant (Personal Digital Assistant, PDA), a handheld device having a wireless communication function, a computing device, another processing device connected to a wireless modem, a vehicle-mounted device, a wearable device, a terminal device in a future 5G network, or the like.

Figure 18:
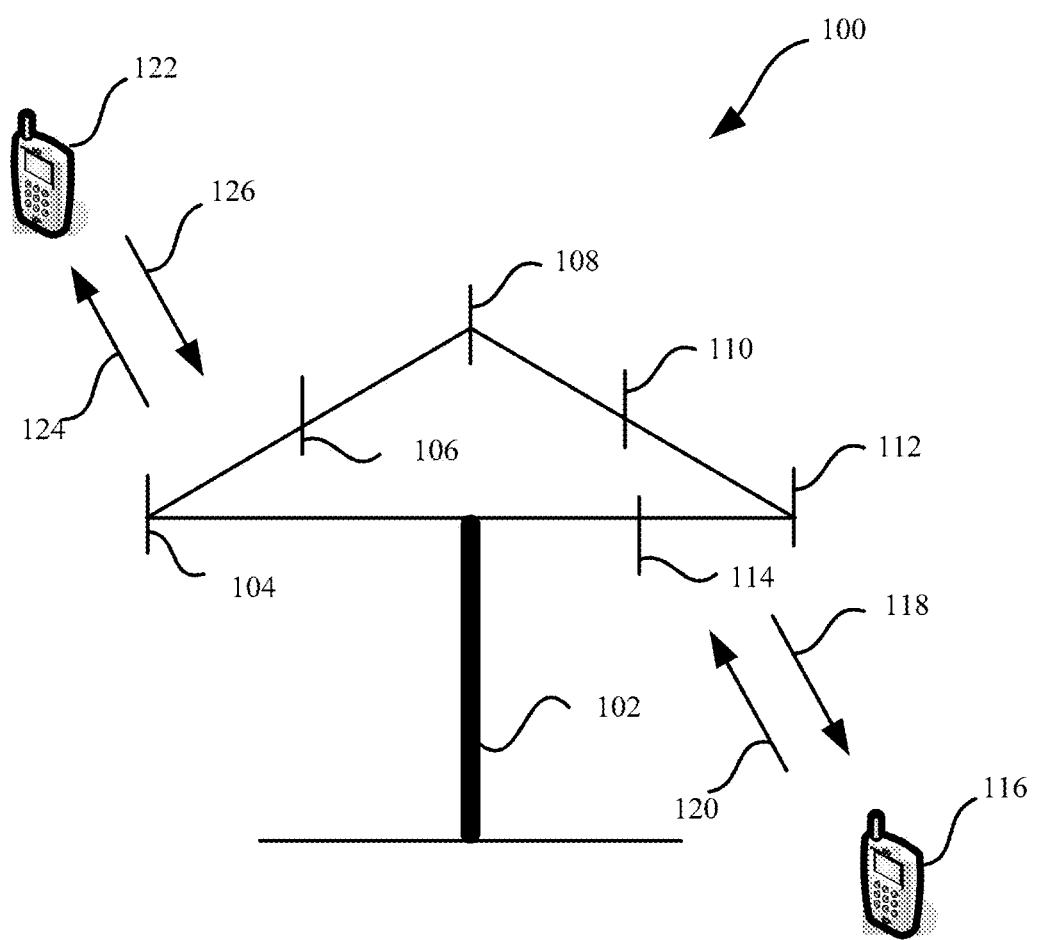
FIG. 18 is a schematic diagram of a wireless communications system according to an embodiment of the present invention.

FIG. 18 shows a wireless communications system 100 according to the embodiments described in this specification. The system 100 includes a base station 102, where the base station 102 may include a plurality of antenna groups. For example, one antenna group may include antennas 104 and 106, another antenna group may include antennas 108 and 110, and an additional group may include antennas 112 and 114. Two antennas are shown for each antenna group. However, more or fewer antennas may be used for each group. The base station 102 may additionally include a transmitter chain and a receiver chain. A person of ordinary skill in the art may understand that both the transmitter chain and the receiver chain may include a plurality of components related to signal sending and receiving, for example, a processor, a modulator, a multiplexer, a demodulator, a demultiplexer, or an antenna.

The base station 102 may communicate with one or more access terminals, for example, an access terminal 116 and an access terminal 122. However, it can be understood that the base station 102 can communicate with any quantity of access terminals similar to the access terminals 116 and 122. The access terminals 116 and 122 may be, for example, a cellular phone, a smart phone, a portable computer, a handheld communications device, a handheld computing device, a satellite radio apparatus, a global positioning system, a PDA, and/or any other appropriate device configured to perform communication in the wireless communications system 100. As shown in the figure, the access terminal 116 communicates with the antennas 112 and 114, where the antennas 112 and 114 send information to the access terminal 116 by using a forward link 118, and receive information from the access terminal 116 by using a reverse link 120. In addition, the access terminal 122 communicates with the antennas 104 and 106, where the antennas 104 and 106 send information to the access terminal 122 by using a forward link 124, and receive information from the access terminal 122 by using a reverse link 126. In a frequency division duplex (Frequency Division Duplex, "FDD" for short) system, for example, the forward link 118 may use a different frequency band from the reverse link 120, and the forward link 124 may use a different frequency band from the reverse link 126. In addition, in a time division duplex (Time Division Duplex, "TDD" for short) system, the forward link 118 and the reverse link 120 may use a same frequency band, and the forward link 124 and the reverse link 126 may use a same frequency band.

Each group of antennas and/or areas designed for communication is referred to as a sector of the base station 102. For example, an antenna group may be designed to communicate with an access terminal in a sector of an area covered by the base station 102. In communication performed by using the forward links 118 and 124, a transmit antenna of the base station 102 may improve, through beamforming, signal-to-noise ratios of the forward links 118 and 124 for the access terminals 116 and 122. In addition, compared with sending information to all access terminals of a base station by the base station by using a single antenna, sending information to the access terminals 116 and 122 dispersed randomly in a related coverage area by the base station 102 through beamforming causes less interference to a mobile device in a neighboring cell.

In a given time, the base station 102, the access terminal 116, and/or the access terminal 122 may be a wireless communications sending apparatus and/or a wireless communications receiving apparatus. When sending data, the wireless communications sending apparatus may encode the data for transmission. Specifically, the wireless communications sending apparatus may have, for example, generate, obtain, or store in a memory, a particular quantity of information bits to be sent to the wireless communications receiving apparatus through a channel. The information bits may be included in a transport block or a plurality of transport blocks of data, and may be segmented to generate a plurality of code blocks. In addition, the wireless communications sending apparatus may encode each code block by using a polar code encoder, to improve data transmission reliability, thereby ensuring communication quality.

Channel coding is usually used in a communications system to improve data transmission reliability and ensure communication quality. A polar code (Polar Codes) proposed by Arikan is a first good code which is theoretically proved to be able to achieve a Shannon capacity and has low encoding and decoding complexity. The Polar code is a linear block code. A generator matrix of the Polar code is $G_N$, and an encoding process of the Polar code is $x_1^N = u_1^N G_N$, where $u_1^N = (u_1, u_2, \ldots, u_N)$ is a binary row vector having a length of N (namely, a code length); $G_N$ is an N×N matrix, and $G_N = F_2^{\otimes (\log_2(N))}$, where $$F_2 = \begin{bmatrix} 1 & 0 \\ 1 & 1 \end{bmatrix},$$

and $F_2^{\otimes(\log_2(N))}$ is a Kronecker (Kronecker) product of $\log_2 N$ matrices $F_2$. The foregoing addition and multiplication operations are all addition and multiplication operations in a binary Galois Field (Galois Field).

In an encoding process of a conventional Polar code (original Arikan Polar code), some bits in $u_1^N$ are used to carry information, and are referred to as information bits, and a set of indexes of the bits is denoted as A; and other bits are set to fixed values pre-agreed upon by a transmitter and a receiver (and are referred to as fixed bits), and a set of indexes of the bits is denoted by using a complementary set $A^c$ of A. These fixed bits are usually set to 0. A fixed bit sequence can be randomly set provided that the transmitter and the receiver pre-agree upon the fixed bit sequence. Therefore, a Polar code encoding output may be simplified into $x_1^N = u_A G_N(A)$, where $u_A$ is a set of the information bits in $u_1^N$, $u_A$ is a row vector having a length of K, namely, |A|=K, |•| indicates a quantity of elements in the set, K is a size of an information block, $G_N(A)$ is a sub-matrix, in the matrix $G_N$, obtained based on rows corresponding to indexes in the set A, and $G_N(A)$ is a K×N matrix. Performance of the Polar code depends on a construction process of the Polar code, namely, a process of selecting the set A. Common construction methods, that is, methods for calculating polar channel reliability include density evolution (density evolution, DE), Gaussian approximation (Gaussian approximation, GA), and linear fitting.

A successive cancellation (Successive Cancellation, SC) decoding algorithm is used for the Polar code. To be specific, sequential decoding is performed starting from the first bit. A successive cancellation list (SC List, SCL) decoding algorithm is an improvement of the SC decoding algorithm, and a plurality of candidate decoding results are remained for each bit. FIG. 1 is a List=2 example of the SCL decoding algorithm. An SCL decoding process is considered as a path searching process, to be specific, performing path expansion by using the first bit as a root node, where a metric value is maintained for each path; and in each expansion (decoding a next bit), maintaining L paths at a current level that have optimal path metrics; and finally, outputting a path with an optimal metric as a decoding result. Maximum likelihood decoding performance can be obtained by using SCL.

A path metric PM (path-metric) of the $i^{th}$ bit of the $l^{th}$ path is calculated as follows:

$$PM_l(i) = \begin{cases} PM_l(i-1), & \text{if an } LLR \text{ is consistent with a decision result} \\ PM_l(i-1) + |LLR(i)|, & \text{if an } LLR \text{ is inconsistent with a decision result} \end{cases}$$

LLR(i) is a log-likelihood ratio of a current bit. A meaning of the foregoing formula is: if an LLR is consistent with a decision result, a PM is unchanged; otherwise, a positive penalty |LLR(i)| is added to the PM. Therefore, a smaller PM indicates a closer distance between a codeword corresponding to the path and a received signal. Finally, a path with a minimum PM is output as a decoding result. In an SCL decoding process, if a current bit is an information bit, each path is expanded into two paths (2L paths in total are obtained through expansion), with decision results being 0 and 1 respectively; a PM of each path is calculated based on the foregoing formula; then expanded paths are sorted based on PMs; and L paths with minimum PMs are remained, and the other L paths are deleted, namely, pruning is performed. If a current bit is a frozen bit (including a dynamic frozen bit), no paths are expanded, and the current bit is directly determined to be a corresponding (dynamic) fixed value, and PMs of the paths are calculated based on the foregoing formula.

As shown in FIG. 2(a), if an LLR(i) of a current to-be-decoded bit is greater than 0 (a corresponding result is 0), and in a path expansion process, if the current bit is an information bit, two paths need to be expanded. If a decision result is 0, and the decision result is consistent with the LLR (denoted by "√" in FIG. 2(a) and FIG. 2(b)), PM(i)=PM(i−1); or if a decision result is 1, and the decision is inconsistent with the LLR (denoted by "x" in FIG. 2(a) and FIG. 2(b)), PM(i)=PM(i−1)+|LLR(i)|. If the current bit is a frozen bit, no expansion is performed, and a PM is calculated based on a known fixed value. If the known fixed value is 0, which is consistent with the LLR, PM(i)=PM(i−1); or if the known fixed value is 1, which is inconsistent with the LLR, PM(i)=PM(i−1)+|LLR(i)|. As shown in FIG. 2(b), if an LLR(i) of a current to-be-decoded bit is less than 0 (a corresponding result is 1), and in a path expansion process, if the current bit is an information bit, two paths need to be expanded. If the current bit is determined to be 0, which is inconsistent with the LLR, PM(i)=PM(i−1)+|LLR(i)|; or if the current bit is determined to be 1, which is consistent with the LLR, PM(i)=PM(i−1). If a current bit is a frozen bit, no expansion is performed, and a PM is calculated based on a known fixed value. If the known fixed value is 0, which is inconsistent with the LLR, PM(i)=PM(i−1)+|LLR(i)|; or if the known fixed value is 1, which is consistent with the LLR, PM(i)=PM(i−1).

Figure 3:
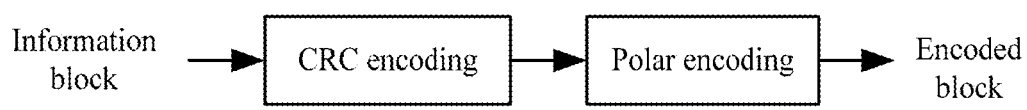
FIG. 3 is a schematic diagram of a CRC-concatenated Polar code encoding process according to an embodiment of the present invention.
Figure 4:
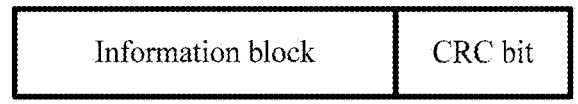
FIG. 4 is a schematic diagram of a CRC encoding output process according to an embodiment of the present invention.

As shown in FIG. 3 and FIG. 4, an encoding manner of concatenating a cyclic redundancy check (Cyclic Redundancy Check) bit to a Polar code is referred to as CA-Polar for short. In a decoding process, CRC check (Cyclic Redundancy Check, cyclic redundancy check) is performed, a path on which CRC succeeds is selected from candidate paths output from SCL decoding as a decoding output. This decoding algorithm is referred to as a CA-SCL (CRC-Aided Successive Cancellation List) decoding algorithm. The CA-SCL decoding algorithm can significantly improve performance of the Polar code.

A CA-Polar code construction process includes a process of determining an information bit position. It is assumed that a size of an information block is Kinfo, a CRC length is Kcrc, and a mother code length of encoding is N. Only Kinfo+Kcrc polar channels with highest reliability need to be selected from N polar channels as information bits, and the others are used as static frozen bits. In a CA-Polar code construction process, CRC encoding is first performed on the information block, then bits obtained after CRC encoding are mapped to information bits, fixed values agreed upon by a transmitter and a receiver are placed at the static frozen bits, and Arikan Polar encoding is performed finally, to obtain a CA-Polar encoded block. The CRC bit may be concatenated to the front or the end of the information block, or distributed inside the information block.

In decoding, both the information block and the CRC bit are unknown, and normal SCL decoding is performed. After the SCL decoding ends, L (a width of path expansion) candidate decoding results are obtained, where the candidate decoding result includes the information block and the CRC bit. CRC check is performed on each candidate decoding result, starting from a candidate decoding result of a path with a minimum PM, and if the check succeeds, the information block of the path is used as a decoding output. Otherwise, the information block of the candidate decoding result of the path with the minimum PM is used as a decoding output, or a decoding failure is directly indicated. A lower block error rate (Block Error Rate, BLER) in CA-Polar is lower than that in SCL.

In an SCL decoding process, CRC bits are all processed as information bits, and are used for path selection only when SCL decoding ends.

Figure 5:
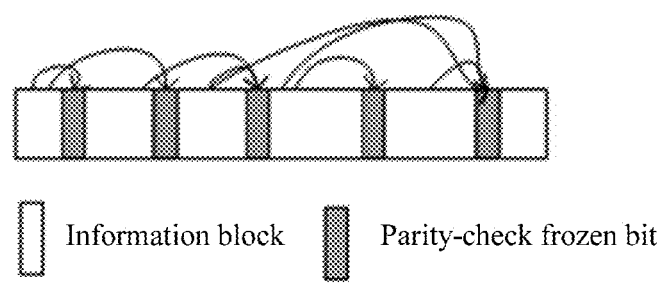
FIG. 5 is a schematic diagram of a parity-check relationship in a PC-Polar encoding method according to an embodiment of the present invention.

As shown in FIG. 5, concatenating a parity-check (Parity-check) bit to a Polar code is referred to as PC-Polar for short, and is another code concatenation method for improving Polar code performance. A main idea of PC-Polar is to select some parity bits (Parity-check-frozen), which are also referred to as dynamic frozen (Dynamic Frozen) bits, and distribute the parity bits into an information block, where a value of a parity bit is determined by an information bit in front of the parity bit based on a parity-check equation.

For PC-Polar, a minimum code distance of a Polar code is mainly improved by performing PC encoding on an information block, so as to improve performance of the Polar code. PC-Polar construction mainly includes two factors. A first point is a position of a parity bit, and the parity bit usually needs to be located in a polar channel with relatively high reliability; and a second point is a parity-check equation, that is, each parity bit is determined by which information bits in front of the parity bit. Once construction is finished, a PC-Polar code encoding process is similar to CA-Polar, and includes two steps: PC encoding and Arikan encoding. PC encoding is determining a value of a parity bit based on a parity-check equation and a value of an information block, and a value known to a transmitter and a receiver is still placed at a static frozen bit. A PC-Polar decoding algorithm is based on an SCL decoding algorithm, processing on an information bit and a static frozen bit is the same as that in the SCL decoding algorithm, and processing on a dynamic frozen bit is different. Because the dynamic frozen bit is not an unknown information bit, but is determined by an information bit in front of the dynamic frozen bit, processing on the dynamic frozen bit is similar to that of the static frozen bit, and a difference lies in that a value of the dynamic frozen bit is calculated by using a decoded information bit in front of the dynamic frozen bit. Because the dynamic frozen bit is related to the information bit in front of the dynamic frozen bit, the dynamic frozen bit actually assists in parity check on a result of the encoding the information bit. Specifically, if the decoded information bit in front of the dynamic frozen bit is incorrect, a possibility that a calculated value of the dynamic frozen bit is inconsistent with an LLR (log likelihood ratio, log-likelihood ratio) of the dynamic frozen bit is greater, and a penalty is added to a PM of a corresponding path, and consequently, the incorrect path is more likely to be deleted during sorting. A path with a minimum PM is finally output by using PC-SCL decoding.

Figure 6:
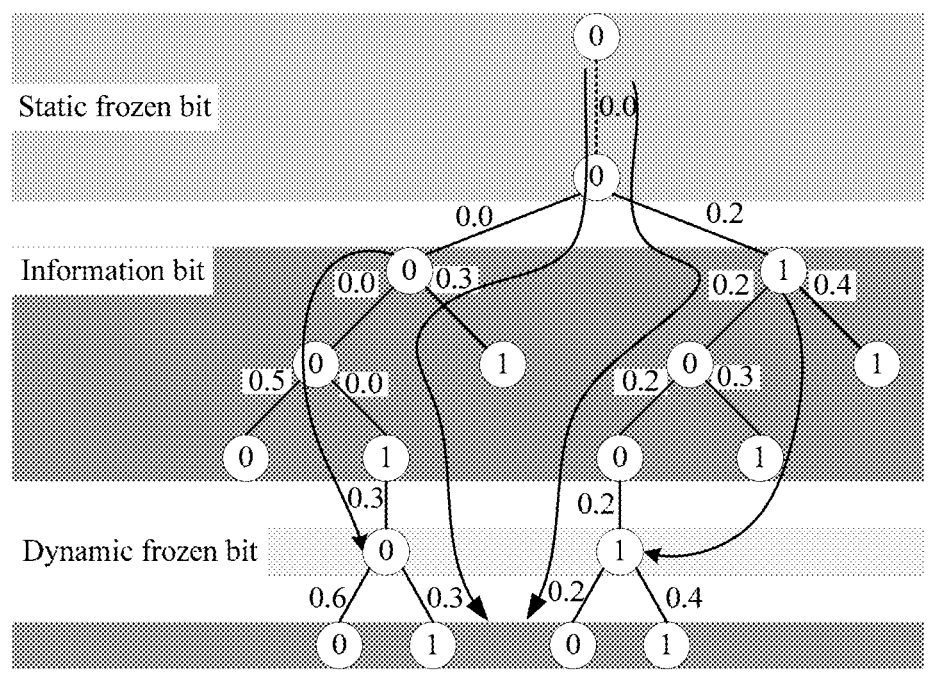
FIG. 6 is a schematic diagram of a PC-SCL decoding process according to an embodiment of the present invention.

FIG. 6 is an example of PC-Polar SCL decoding. An arrow between a dynamic frozen bit and an information bit indicates a parity-check relationship between the dynamic frozen bit and the information bit. In decoding of a dynamic frozen bit, on each decoding path, a value of the dynamic frozen bit is calculated by using a value of a decoded information bit based on the parity-check relationship, and is used for decoding. A position of the dynamic frozen bit in PC-Polar plays an important role for performance, and needs to be selected carefully in construction.

Various concepts or implementations described above are suitable for any of the following embodiments.

Figure 7:
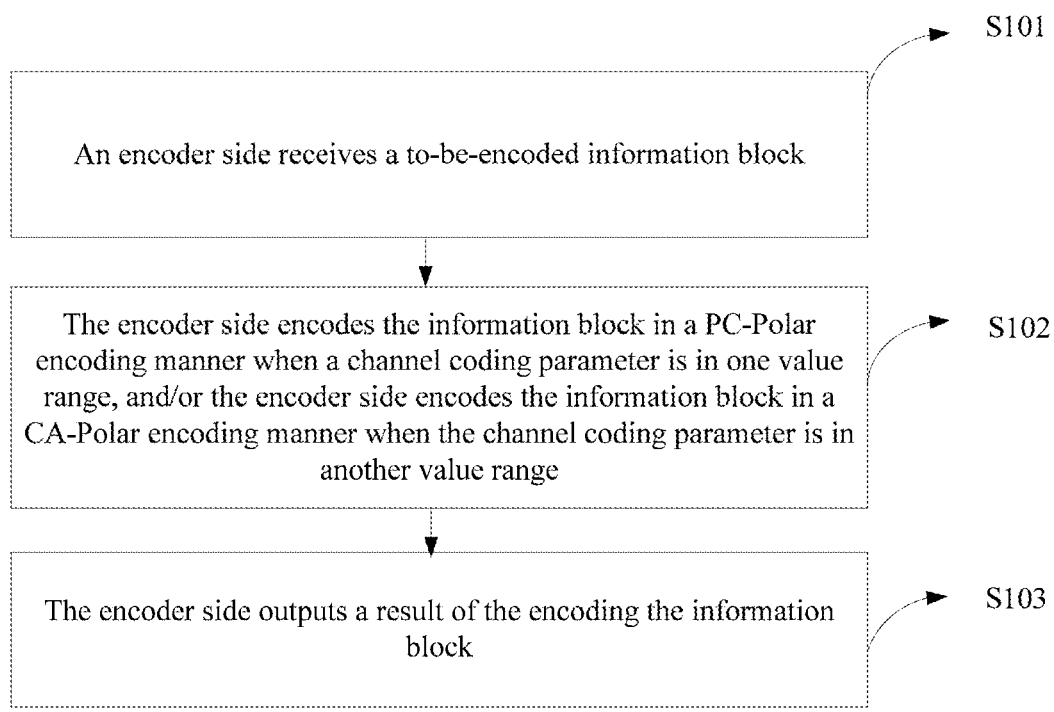
FIG. 7 is a schematic diagram of a first data processing method according to an embodiment of the present invention.

FIG. 7 is a schematic flowchart of a data processing method according to an embodiment of the present invention. The data processing method includes:

S101. An encoder receives a to-be-encoded information block.

S102. The encoder encodes the information block in a PC-Polar encoding manner when a channel coding parameter is in one value range, and/or the encoder encodes the information block in a CA-Polar encoding manner when the channel coding parameter is in another value range.

S103. The encoder outputs a result of the encoding the information block.

According to the data processing method shown in FIG. 7, different encoding manners are selected based on different ranges of the channel coding parameter, so as to exploit an advantage of each encoding manner by combining features of the encoding manners, thereby improving a comprehensive encoding effect, for example, obtaining a system throughput gain.

In the embodiment shown in FIG. 7, the encoder may be any device that has a wireless communication function, for example, an access point, a site, user equipment, or a base station.

In specific implementation of step S102, the encoding, by the encoder, the information block in a PC-Polar encoding manner when a channel coding parameter is in one value range, and encoding, by the encoder, the information block in a CA-Polar encoding manner when the channel coding parameter is in another value range may specifically include the following two cases.

In a first case, when channel coding parameters make true $K/M<1/6$ or a channel coding parameter $K>48$, the information block is encoded in the PC-Polar encoding manner, where M indicates a code length, K indicates an information bit length of the information block, and $K/M<1/6$ means that $K/M<1/6$.

In the first case, after step S103, the data processing method shown in FIG. 7 may further include:

S104. A decoder decodes, in a PC-Polar decoding manner, a result of the encoding that has been transmitted through a channel.

In a second case, when channel coding parameters make true $K/M>1/12$ or a channel coding parameter $K<120$, the information block is encoded in the CA-Polar encoding manner, where M indicates a code length, K indicates an information bit length of the information block; and $K/M>1/12$ means that $K/M>1/12$.

In the second case, after step S103, the data processing method shown in FIG. 7 may further include:

S105. A decoder decodes, in a CA-Polar decoding manner, a result of the encoding that has been transmitted through a channel.

It should be noted that, when the channel coding parameters make true $K/M=1/6$ or $K/M=1/12$ or the channel coding parameter $K=48$, $K=64$, $K=80$, or $K=120$, the encoder may encode the information block in the PC-Polar encoding manner, and correspondingly, the decoder may decode, in the PC-Polar decoding manner, the result of the encoding that has been transmitted through a channel. When the channel coding parameters make true $K/M=1/6$ or $K/M=1/12$ or the channel coding parameter $K=48$, $K=64$, $K=80$, or $K=120$, the encoder may alternatively encode the information block in the CA-Polar encoding manner, and correspondingly, the decoder may decode, in the CA-Polar decoding manner, the result of the encoding that has been transmitted through a channel.

In this embodiment of the data processing method shown in FIG. 7, step S102 may be replaced with: encoding, by the encoder, the information block in a PC-Polar encoding manner according to an instruction of first instruction signaling, where the first instruction signaling is used to instruct to encode the information block in the PC-Polar encoding manner. Specifically, the first instruction signaling may be carried on a physical channel such as a broadcast channel or a control channel.

In this embodiment of the data processing method shown in FIG. 7, step S102 may be alternatively replaced with: encoding, by the encoder, the information block in a CA-Polar encoding manner according to an instruction of second instruction signaling, where the second instruction signaling is used to instruct to encode the information block in the CA-Polar encoding manner. Specifically, the second instruction signaling may be carried on a physical channel such as a broadcast channel or a control channel.

Figure 8:
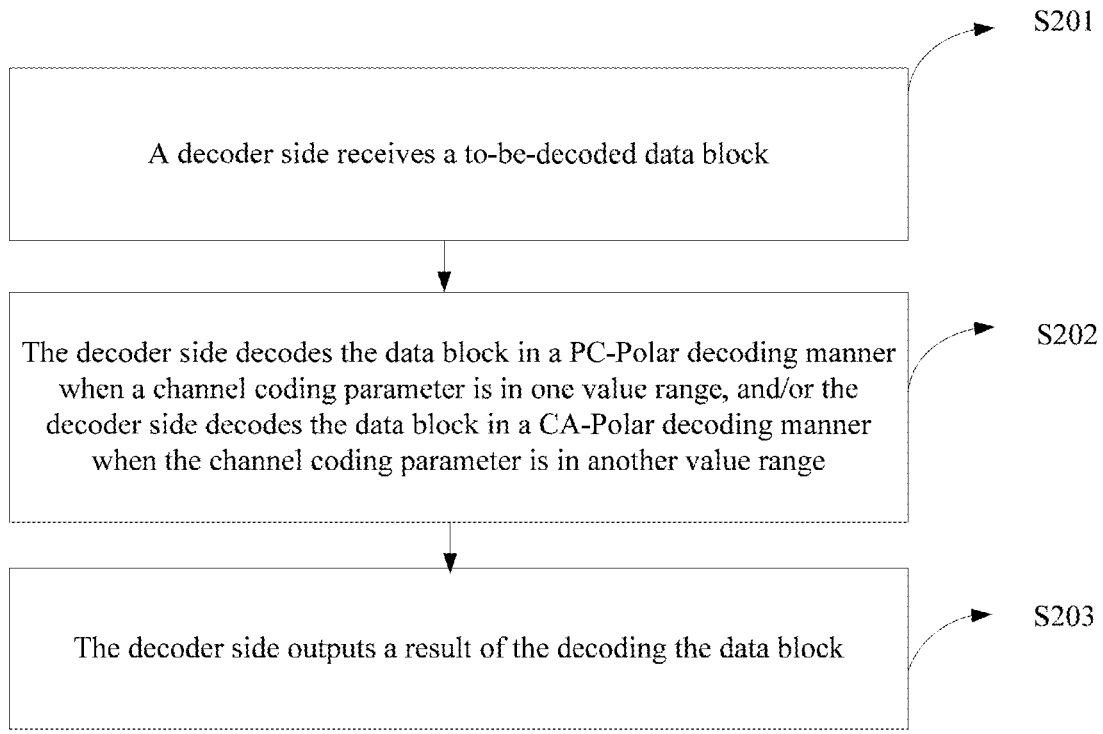
FIG. 8 is a schematic diagram of a second data processing method according to an embodiment of the present invention.

FIG. 8 is a schematic flowchart of another data processing method according to an embodiment of the present invention. The data processing method in FIG. 8 includes:

S201. A decoder receives a to-be-decoded data block.

S202. The decoder decodes the data block in a PC-Polar decoding manner when a channel coding parameter is in one value range, and/or the decoder decodes the data block in a CA-Polar decoding manner when the channel coding parameter is in another value range.

S203. The decoder outputs a result of the decoding the data block.

According to the data processing method shown in FIG. 8 provided in this embodiment of the present invention, different decoding manners are selected based on ranges of the channel coding parameter, so as to exploit an advantage of each decoding manner by combining features of the decoding manners, thereby improving a comprehensive decoding effect, for example, obtaining a system throughput gain.

In the embodiment shown in FIG. 8, the decoder may be any device that has a wireless communication function, for example, an access point, a site, user equipment, or a base station.

In specific implementation of step S202, the decoding, by the decoder, the data block in a PC-Polar decoding manner when a channel coding parameter is in one value range, and/or decoding, by the decoder, the data block in a CA-Polar decoding manner when the channel coding parameter is in another value range may specifically include the following two cases.

In a first case, the data block is decoded in the PC-Polar decoding manner when channel coding parameters make true $K/M<1/6$ or a channel coding parameter $K>48$, where M indicates a code length for encoding the data block, K indicates an information bit length of the data block before being encoded, and $K/M<1/6$ means that $K/M<1/6$.

In the first case, before step S201, the data processing method shown in FIG. 8 may further include:

S2001. An encoder encodes an information block in a PC-Polar encoding manner, where the data block is a result of channel transmission of an encoded information block.

In a second case, the data block is decoded in the CA-Polar decoding manner when channel coding parameters make true $K/M>1/12$ or a channel coding parameter $K<120$, where M indicates a code length for encoding the data block, K indicates an information bit length of the data block before being encoded, and $K/M>1/12$ means that $K/M>1/12$.

In the second case, before step S201, the data processing method shown in FIG. 8 may further include:

S2002. An encoder encodes an information block in a CA-Polar encoding manner, where the data block is a result of channel transmission of an encoded information block.

It should be noted that in the foregoing embodiment, when the channel coding parameters make true $K/M=1/6$ or $K/M=1/12$ or the channel coding parameter $K=48$, $K=64$, $K=80$, or $K=120$, the encoder may encode the information block in the PC-Polar encoding manner, and correspondingly, the decoder may decode, in the PC-Polar decoding manner, a result of the encoding that has been transmitted through a channel. When the channel coding parameters make true $K/M=1/6$ or $K/M=1/12$ or the channel coding parameter $K=48$, $K=64$, $K=80$, or $K=120$, the encoder may alternatively encode the information block in the CA-Polar encoding manner, and correspondingly, the decoder may decode, in the CA-Polar decoding manner, a result of the encoding that has been transmitted through a channel.

In this embodiment of the data processing method shown in FIG. 8, step S202 may be replaced with: decoding, by the decoder, the data block in a PC-Polar decoding manner according to an instruction of third instruction signaling, where the third instruction signaling is used to instruct to decode the data block in the PC-Polar decoding manner. Specifically, the third instruction signaling may be carried on a physical channel such as a broadcast channel or a control channel.

In this embodiment of the data processing method shown in FIG. 8, step S202 may be replaced with: decoding, by the decoder, the data block in a CA-Polar decoding manner according to an instruction of fourth instruction signaling, where the fourth instruction signaling is used to instruct to decode the data block in the CA-Polar decoding manner. Specifically, the fourth instruction signaling may be carried on a physical channel such as a broadcast channel or a control channel.

In the foregoing embodiments of the data processing methods shown in FIG. 7 and FIG. 8, specifically, a length of the information block is K1, and the encoding the information block in a CA-Polar encoding manner includes: generating X1 parity bits based on the information block having a length of K1 and a parity-check equation; concatenating the X1 parity bits to the information block or distributing the X1 parity bits into the information block; mapping K1+X1 bits comprising the information block and the X1 parity bits to information bits; placing, at a position of a static fixed bit, a fixed value agreed upon by the encoder and the decoder; and then performing Arikan Polar encoding, where the parity-check equation is used to represent a constraint relationship between the information block and the X1 parity bits.

In the foregoing embodiments of the data processing methods shown in FIG. 7 and FIG. 8, specifically, a length of the information block is K2, and the encoding the information block in a PC-Polar encoding manner includes: generating X2 parity bits based on the information block having a length of K2 and a parity-check equation; distributing the X2 parity bits into the information block; mapping K2+X2 bits comprising the information block and the X2 parity bits to information bits; placing, at a position of a static fixed bit, a fixed value agreed upon by the encoder and the decoder; and then performing Arikan Polar encoding, where the parity-check equation represents a constraint relationship between the information block and the X2 parity bits.

In the foregoing embodiments of the data processing methods shown in FIG. 7 and FIG. 8, specifically, the performing, by a decoder, decoding in a CA-Polar decoding manner includes: obtaining a plurality of candidate results through decoding in a successive cancellation decoding manner and an extended decoding manner thereof, where the candidate result includes the information block and a parity bit; and performing parity check on the plurality of candidate results by using a parity-check equation, where an information block in a candidate result on which parity check succeeds is the result of the decoding, or when parity check on all the plurality of candidate results fails, an information block in a candidate result of a path with a minimum PM (path-metric) is the result of the decoding.

The performing parity check on the plurality of candidate results by using a parity-check equation may specifically include: performing parity check on the plurality of candidate results by using the parity-check equation in ascending order of PM values, starting from the candidate result of the path with the minimum PM value.

In the foregoing embodiments of the data processing methods shown in FIG. 7 and FIG. 8, specifically, the performing, by a decoder, decoding in a PC-Polar decoding manner includes: selecting a decoding path in a decoding process by using a parity bit and a parity-check equation, and when a value of the parity bit is consistent with a decision result of a corresponding LLR (log likelihood ratio, log-likelihood ratio), unchanging a PM; otherwise, adding a positive penalty |LLR| to a PM, and using an information block in a path with a minimum PM (path-metric) value as the result of the decoding.

In the foregoing embodiments of the data processing methods shown in FIG. 7 and FIG. 8, specifically, the CA-Polar encoding manner may be any CA-Polar encoding manner specified in a 3GPP (3rd Generation Partnership Project) standard, the PC-Polar encoding manner may be any PC-Polar encoding manner specified in the 3GPP standard, the CA-Polar decoding manner may be any CA-Polar decoding manner specified in the 3GPP standard, and the PC-Polar decoding manner may be any PC-Polar decoding manner specified in the 3GPP standard.

In the foregoing embodiments of the data processing methods shown in FIG. 7 and FIG. 8, the channel coding parameter is a parameter related to channel encoding and/or channel decoding. The channel coding parameter may specifically include at least one of the following parameters: N, M, K, L, and a derived parameter determined by at least one of N, M, K, and L, where N indicates a mother code length of Polar encoding, M indicates the code length, K indicates the length of the information block, and L indicates a search width in a decoding process.

In the foregoing embodiments of the data processing methods shown in FIG. 7 and FIG. 8, specifically, in a range of K/M<1/6, K/M is any value in the range of K/M<1/6. In addition, in the range of K/M<1/6, K/M<1/12 may be specifically selected.

In the foregoing embodiments of the data processing methods shown in FIG. 7 and FIG. 8, specifically, in a range of K/M>1/12, K/M is any value in the range of K/M>1/12. In addition, in the range of K/M>1/12, K/M>1/6 may be specifically selected.

In the foregoing embodiments of the data processing methods shown in FIG. 7 and FIG. 8, specifically, in a range of K>48, K is any value in the range of K>48. In addition, in the range of K>48, K>64 may be specifically selected; in a range of K>64, K>80 may be specifically selected; and in a range of K>80, K>120 may be specifically selected.

In the foregoing embodiments of the data processing methods shown in FIG. 7 and FIG. 8, specifically, in a range of K<120, K is any value in the range of K<120. In addition, in the range of K<120, K<80 may be specifically selected; in a range of K<80, K<64 may be specifically selected; and in a range of K<64, K<48 may be specifically selected.

Figure 9:
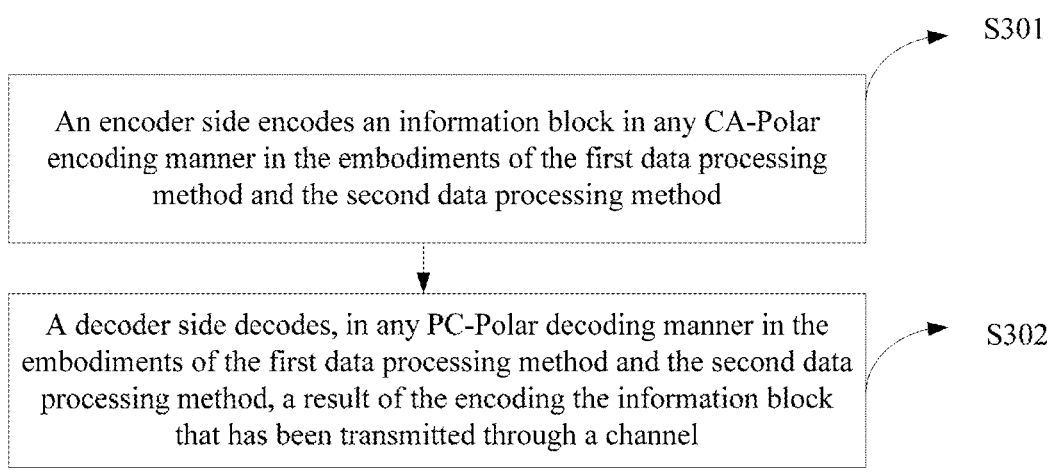
FIG. 9 is a schematic diagram of a third data processing method according to an embodiment of the present invention.

FIG. 9 is another data processing method according to an embodiment of the present invention. The data processing method shown in FIG. 9 includes:

S301. An encoder encodes an information block in any CA-Polar encoding manner in the foregoing embodiments of the data processing methods shown in FIG. 7 and FIG. 8.

S302. A decoder decodes, in any PC-Polar decoding manner in the foregoing embodiments of the data processing methods shown in FIG. 7 and FIG. 8, a result of the encoding the information block that has been transmitted through a channel.

According to the data processing method shown in FIG. 9 provided in this embodiment of the present invention, different decoding manners are selected, so as to exploit an advantage of each decoding manner by combining features of the decoding manners, thereby improving a comprehensive decoding effect, for example, obtaining a system throughput gain.

In the embodiment of the data processing method shown in FIG. 9, a value of a channel coding parameter may be the same as the value of the channel coding parameter in the data processing methods shown in FIG. 7 and FIG. 8 in which the encoder uses the CA-Polar encoding manner and the decoder uses the PC-Polar decoding manner.

Figure 10:
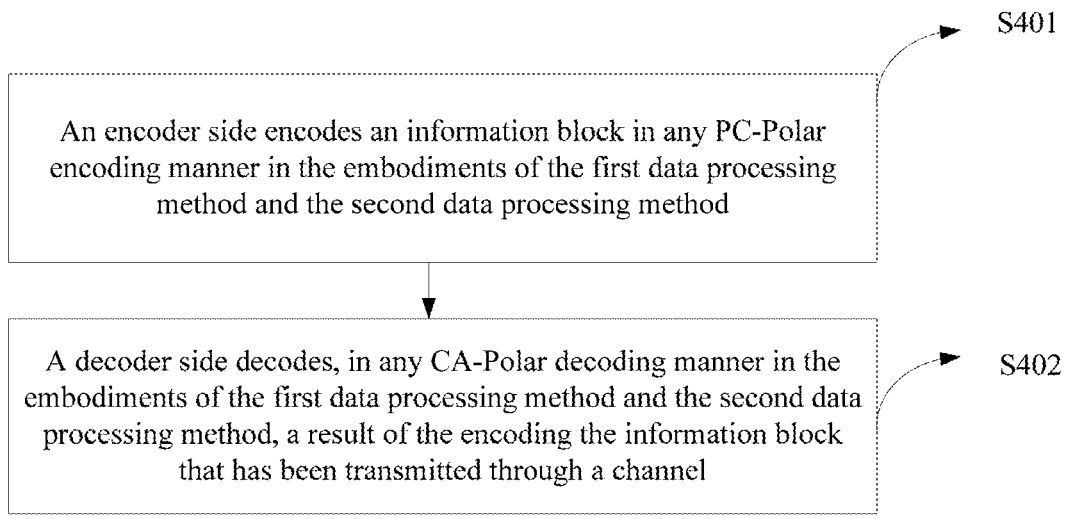
FIG. 10 is a schematic diagram of a fourth data processing method according to an embodiment of the present invention.

FIG. 10 is a schematic flowchart of another data processing method according to an embodiment of the present invention. The data processing method shown in FIG. 10 includes:

S401. An encoder encodes an information block in any PC-Polar encoding manner in the foregoing embodiments of the data processing methods shown in FIG. 7 and FIG. 8.

S402. A decoder decodes, in any CA-Polar decoding manner in the foregoing embodiments of the data processing methods shown in FIG. 7 and FIG. 8, a result of the encoding the information block that has been transmitted through a channel.

According to the data processing method shown in FIG. 10 provided in this embodiment of the present invention, different decoding manners are selected, so as to exploit an advantage of each decoding manner by combining features of the decoding manners, thereby improving a comprehensive decoding effect, for example, obtaining a system throughput gain.

In the embodiment of the data processing method shown in FIG. 10, a value of a channel coding parameter may be the same as the value of the channel coding parameter in the data processing methods shown in FIG. 7 and FIG. 8 in which the encoder uses the PC-Polar encoding manner and the decoder uses the CA-Polar decoding manner.

Figure 11:
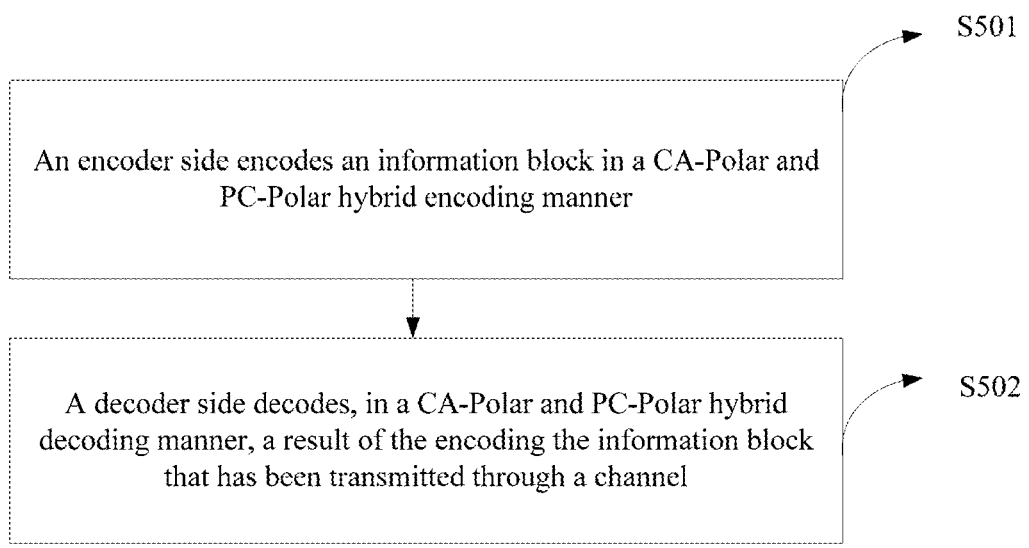
FIG. 11 is a schematic diagram of a fifth data processing method according to an embodiment of the present invention.

FIG. 11 is a schematic flowchart of another data processing method according to an embodiment of the present invention. The data processing method shown in FIG. 11 includes:

S501. An encoder encodes an information block in a CA-Polar and PC-Polar hybrid encoding manner.

S502. A decoder decodes, in a CA-Polar and PC-Polar hybrid decoding manner, a result of the encoding the information block that has been transmitted through a channel.

According to the data processing method shown in FIG. 11 provided in this embodiment of the present invention, advantages of CA-Polar and PC-Polar are combined, and an encoding and decoding manner of combining the both are used, so that a comprehensive encoding and decoding effect can be improved, for example, a system throughput gain is obtained.

In this embodiment of the data processing method shown in FIG. 11, specifically, a length of the information block is K, and an implementation of the encoding the information block in a CA-Polar and PC-Polar hybrid encoding manner includes: generating X parity bits based on the information block having a length of K and a first parity-check equation; concatenating the X parity bits to the information block; generating Y parity bits based on a second parity-check equation and K+X bits comprising the information block and the X parity bits; arranging the Y parity bits together with the K+X bits (for example, concatenating the Y parity bits to a head or a tail of the K+X bits or inserting the Y parity bits into the K+X bits, to form K+X+Y bits); mapping the K+X+Y bits comprising the information block, the X parity bits, and the Y parity bits to information bits; placing, at a position of a static fixed bit, a fixed value agreed upon by the encoder and the decoder; and then performing Arikan Polar encoding, to obtain a Polar encoded block, where the first parity-check equation is used to represent a constraint relationship between an information bit in the information block and the X parity bits, and the second parity-check equation is used to represent a constraint relationship between the K+X bits and the Y parity bits.

In this embodiment of the data processing method shown in FIG. 11, specifically, a length of the information block is K, and another implementation of the encoding the information block in a CA-Polar and PC-Polar hybrid encoding manner includes: generating X parity bits based on the information block having a length of K and a first parity-check equation; distributing the X parity bits into the information block; generating Y parity bits based on a second parity-check equation and K+X bits comprising the information block and the X parity bits; concatenating the Y parity bits to the K+X bits; mapping K+X+Y bits comprising the information block, the X parity bits, and the Y parity bits to information bits; placing, at a position of a static fixed bit, a fixed value agreed upon by the encoder and the decoder; and then performing Arikan Polar encoding, where the first parity-check equation is used to represent a constraint relationship between an information bit in the information block and the X parity bits, and the second parity-check equation is used to represent a constraint relationship between the K+X bits and the Y parity bits.

In this embodiment of the data processing method shown in FIG. 11, specifically, the decoding, by a decoder in a CA-Polar and PC-Polar hybrid decoding manner includes: selecting a decoding path by using the Y parity bits and the second parity-check equation in a decoding path selection manner of a PC-Polar decoding manner, to obtain a plurality of candidate results, where the candidate result includes the information block and the X parity bits; and performing parity check on the plurality of candidate results by using the first parity-check equation, where an information block in a candidate result on which parity check succeeds is a result of the decoding, or when parity check on all the plurality of candidate results fails, an information block in a candidate result of a path with a minimum PM (path-metric) value is a result of the decoding.

The performing parity check on the plurality of candidate results by using a parity-check equation may specifically include: performing parity check on the plurality of candidate results by using the first parity-check equation in ascending order of PM values, starting from the candidate result of the path with the minimum PM value.

In the foregoing embodiment, the generating Y parity bits based on a second parity-check equation and K+X bits comprising the information block and the X parity bits specifically includes:

determining Y dynamic frozen bits in remaining N−K−X polar channels other than K+X polar channels in which the K+X bits are located, and constructing the second parity-check equation, calculating values of the dynamic frozen bits based on values of the K+X bits and the second parity-check equation, and placing a fixed bit that is agreed upon at a static frozen bit, where the second parity-check equation is constructed based on a polynomial, and the polynomial may be a CRC polynomial, or a simple prime-based shift register, for example, the register is based on an agreed prime Q. An information bit that is in front of the dynamic frozen bit and has a number the same as a result of a dynamic frozen bit number modulo Q is selected as an information bit that participates in parity check on the dynamic frozen bit. For example, if Q=5, and a polar channel U18 is determined as a dynamic frozen bit, information bits (if yes) on polar channels U13, U8, and U3 are used as information bits of U18, namely, $$U18=U3+U8+U13.$$

If U3 is not an information bit, U3 does not participate in check, and the parity-check equation is changed to $$U18=U8+U13.$$

If none of U13, U8, and U3 are an information bit, the parity-check equation is changed to $$U18=0.$$

To be specific, U18 degrades into a static frozen bit. Due to a sequential decoding feature of an SC algorithm of a Polar code, the dynamic frozen bit can be used to check only an information bit in front of the dynamic frozen bit. Therefore, frozen bits in front of the first information bit check no information bit, and all degrade into static frozen bits, which are temporarily referred to as dynamic frozen bits herein. The prime-based shift register is easily implemented by hardware. Arikan Polar encoding is performed on the information bit, the dynamic frozen bit, and the static frozen bit, to obtain a Polar encoded block.

Correspondingly, in decoding of the decoder, SCL decoding is performed based on PC-Polar. To be specific, the dynamic frozen bit is processed as a frozen bit, and a value is determined based on the second parity-check equation by a decoded information bit in front of the dynamic frozen bit, to obtain candidate paths; and after SCL decoding ends, a path on which CRC check succeeds is selected as a decoding result from the candidate paths by performing CRC.

In this embodiment of the data processing method shown in FIG. 11, specifically, the CA-Polar and PC-Polar hybrid encoding manner may be any CA-Polar and PC-Polar hybrid encoding manner specified in a 3GPP (3rd Generation Partnership Project) standard, and the CA-Polar and PC-Polar hybrid decoding manner may be any CA-Polar and PC-Polar hybrid decoding manner in the 3GPP standard.

In this embodiment of the data processing method shown in FIG. 11, before step S501, the method further includes: receiving, by the encoder, a value of X and/or a value of Y. Specifically, the value of X and/or the value of Y may be carried on a physical channel such as a broadcast channel or a control channel.

In this embodiment of the data processing method shown in FIG. 11, before step S501, the method further includes: receiving, by the encoder, an index (index) of X and/or an index of Y, where the index of X is used to obtain a value of X by the encoder based on the index of X, and the index of Y is used to obtain a value of Y by the encoder based on the index of Y. Specifically, the index of X and/or the index of Y may be carried on a physical channel such as a broadcast channel or a control channel.

In this embodiment of the data processing method shown in FIG. 11, before step S502, the method further includes: receiving, by the decoder, the value of X and/or the value of Y. Specifically, the value of X and/or the value of Y may be carried on a physical channel such as a broadcast channel or a control channel.

In this embodiment of the data processing method shown in FIG. 11, before step S502, the method further includes: receiving, by the decoder, the index (index) of X and/or the index of Y, where the index of X is used to obtain the value of X by the decoder based on the index of X, and the index of Y is used to obtain the value of Y by the decoder based on the index of Y. Specifically, the index of X and/or the index of Y may be carried on a physical channel such as a broadcast channel or a control channel.

In this embodiment of the data processing method shown in FIG. 11, Y is greater than or equal to 0, and less than or equal to a code length (for example, 2048).

In this embodiment of the data processing method shown in FIG. 11, X is greater than or equal to 0, and less than or equal to 24.

Figure 12:
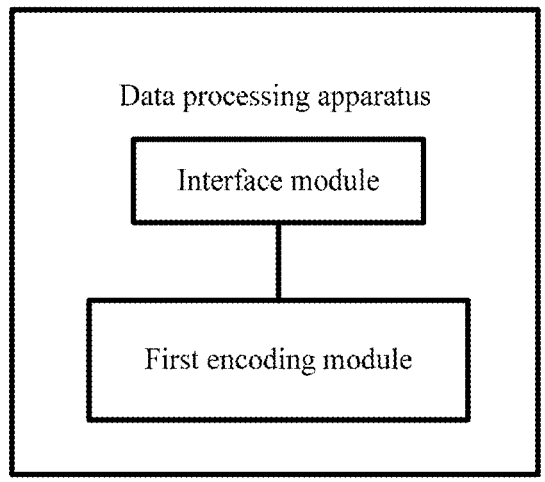
FIG. 12 is a schematic diagram of a first data processing apparatus according to an embodiment of the present invention.

FIG. 12 is a schematic structural diagram of a data processing apparatus according to an embodiment of the present invention. The data processing apparatus includes:

an interface module, configured to receive a to-be-encoded information block; and a first encoding module, configured to encode the information block in a PC-Polar encoding manner when a channel coding parameter is in one value range, and/or encode the information block in a CA-Polar encoding manner when the channel coding parameter is in another value range.

The interface module is further configured to output a result of the encoding the information block.

The data processing apparatus shown in FIG. 12 provided in this embodiment of the present invention may be configured to perform the embodiments of the data processing method shown in FIG. 7. An implementation principle and a technical effect of the data processing apparatus are similar to those of the data processing method. Details are not described herein again. Specifically, various specific implementations of S101 and S103 in the data processing method shown in FIG. 7 may also be correspondingly used as various specific implementations of functions of the interface module of the data processing apparatus shown in FIG. 12. Various specific implementations of S102 in the data processing method shown in FIG. 7 may also be correspondingly used as various specific implementations of functions of the first encoding module of the data processing apparatus shown in FIG. 12. The data processing apparatus shown in FIG. 12 may further include a first decoding module (not shown in the figure). Various specific implementations of S104 in the data processing method shown in FIG. 7 may also be correspondingly used as various specific implementations of functions of the first decoding module of the data processing apparatus shown in FIG. 12.

Figure 13:
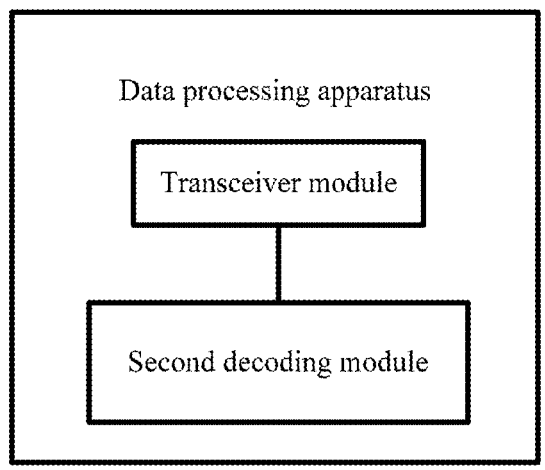
FIG. 13 is a schematic diagram of a second data processing apparatus according to an embodiment of the present invention.

FIG. 13 is a schematic structural diagram of another data processing apparatus according to an embodiment of the present invention. The data processing apparatus shown in FIG. 13 includes: a transceiver module, configured to receive a to-be-decoded data block; and a second decoding module, configured to decode the data block in a PC-Polar decoding manner when a channel coding parameter is in one value range, and/or decode the data block in a CA-Polar decoding manner when the channel coding parameter is in another value range. The transceiver module is further configured to output a result of the decoding the data block.

The data processing apparatus shown in FIG. 13 provided in this embodiment of the present invention may be configured to perform the embodiments of the data processing method shown in FIG. 8. An implementation principle and a technical effect of the data processing apparatus are similar to those of the data processing method. Details are not described herein again. Specifically, various specific implementations of S201 and S203 in the data processing method shown in FIG. 8 may also be correspondingly used as various specific implementations of functions of the transceiver module of the data processing apparatus shown in FIG. 13. Various specific implementations of S202 in the data processing method shown in FIG. 8 may also be correspondingly used as various specific implementations of functions of the second decoding module of the data processing apparatus shown in FIG. 13. The data processing apparatus shown in FIG. 13 may further include a second encoding module (not shown in the figure). Various specific implementations of S2001 or S2002 in the data processing method shown in FIG. 8 may also be correspondingly used as various specific implementations of functions of the second encoding module of the data processing apparatus shown in FIG. 13.

Figure 14:
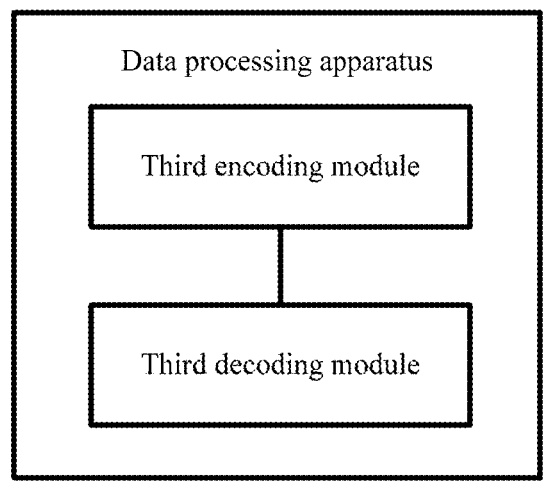
FIG. 14 is a schematic diagram of a third data processing apparatus according to an embodiment of the present invention.

FIG. 14 is a schematic structural diagram of another data processing apparatus according to an embodiment of the present invention. The data processing apparatus shown in FIG. 14 includes:

a third encoding module, configured to encode an information block in any CA-Polar encoding manner in the embodiments of the data processing methods shown in FIG. 7 and FIG. 8; and a third decoding module, configured to decode, in any PC-Polar decoding manner in the embodiments of the data processing methods shown in FIG. 7 and FIG. 8, a result of the encoding the information block that has been transmitted through a channel.

The data processing apparatus shown in FIG. 14 provided in this embodiment of the present invention may be configured to perform the embodiments of the data processing method shown in FIG. 9. An implementation principle and a technical effect of the data processing apparatus are similar to those of the data processing method. Details are not described herein again. Specifically, various specific implementations of S301 in the data processing method shown in FIG. 9 may also be correspondingly used as various specific implementations of functions of the third encoding module of the data processing apparatus shown in FIG. 14. Various specific implementations of S302 in the data processing method shown in FIG. 9 may also be correspondingly used as various specific implementations of functions of the third decoding module of the data processing apparatus shown in FIG. 14.

Figure 15:
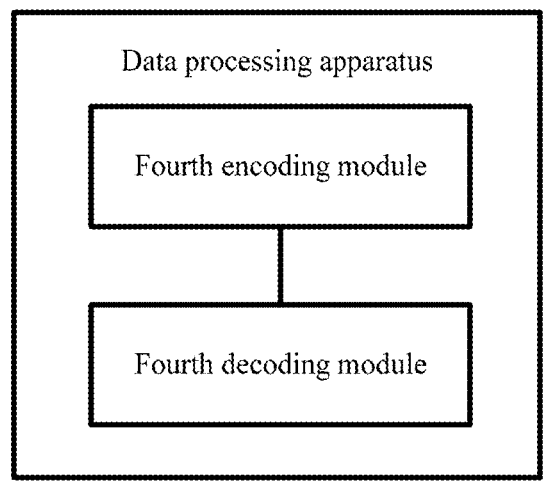
FIG. 15 is a schematic diagram of a fourth data processing apparatus according to an embodiment of the present invention.

FIG. 15 is a schematic structural diagram of another data processing apparatus according to an embodiment of the present invention. The fourth data processing apparatus shown in FIG. 15 includes:

a fourth encoding module, configured to encode an information block in any PC-Polar encoding manner in the embodiments of the data processing methods shown in FIG. 7 and FIG. 8; and a fourth decoding module, configured to decode, in any CA-Polar decoding manner in the embodiments of the data processing methods shown in FIG. 7 and FIG. 8, a result of the encoding the information block that has been transmitted through a channel.

The data processing apparatus shown in FIG. 15 provided in this embodiment of the present invention may be configured to perform the embodiments of the data processing method shown in FIG. 10. An implementation principle and a technical effect of the data processing apparatus are similar to those of the data processing method. Details are not described herein again. Specifically, various specific implementations of S401 in the data processing method shown in FIG. 10 may also be correspondingly used as various specific implementations of functions of the fourth encoding module of the data processing apparatus shown in FIG. 15. Various specific implementations of S402 in the data processing method shown in FIG. 10 may also be correspondingly used as various specific implementations of functions of the fourth decoding module of the fourth data processing apparatus shown in FIG. 15.

Figure 16:
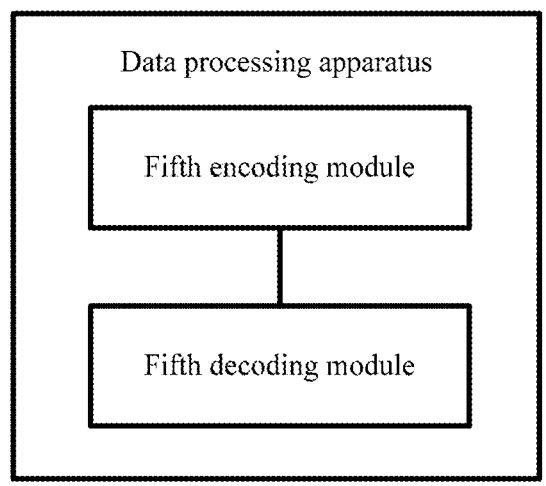
FIG. 16 is a schematic diagram of a fifth data processing apparatus according to an embodiment of the present invention.

FIG. 16 is a schematic structural diagram of another data processing apparatus according to an embodiment of the present invention. The data processing apparatus shown in FIG. 16 includes:

a fifth encoding module, configured to encode an information block in a CA-Polar and PC-Polar hybrid encoding manner; and a fifth decoding module, configured to decode, in a CA-Polar and PC-Polar hybrid decoding manner, a result of the encoding the information block that has been transmitted through a channel.

The fifth data processing apparatus shown in FIG. 16 provided in this embodiment of the present invention may be configured to perform the embodiments of the data processing method shown in FIG. 11. An implementation principle and a technical effect of the data processing apparatus are similar to those of the data processing method. Details are not described herein again. Specifically, various specific implementations of S501 in the data processing method shown in FIG. 11 may also be correspondingly used as various specific implementations of functions of the fifth encoding module of the data processing apparatus shown in FIG. 16. Various specific implementations of S502 in the data processing method shown in FIG. 11 may also be correspondingly used as various specific implementations of functions of the fifth decoding module of the data processing apparatus shown in FIG. 16.

Figure 17:
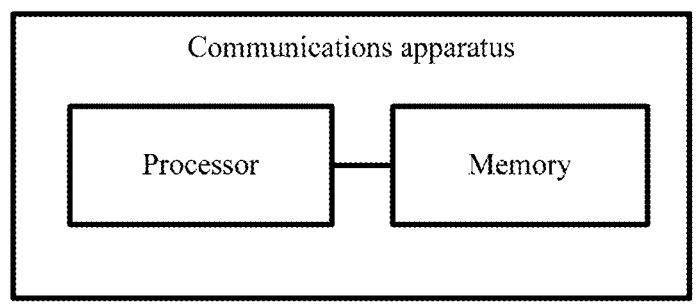
FIG. 17 is a schematic diagram of a communications apparatus according to an embodiment of the present invention.

FIG. 17 is a schematic structural diagram of a communications apparatus according to an embodiment of the present invention. The communications apparatus includes: a processor and a memory having a signal connection to the processor. When the communications apparatus runs, the processor reads and executes an instruction in the memory or runs a hardware logic circuit of the processor, so that the communications apparatus performs the embodiments of any one of the data processing methods shown in FIG. 7 to FIG. 11.

In this embodiment of the communications apparatus, the memory is configured to store the instruction, and the memory may be independent of the processor, or may be integrated into the processor.

The communications apparatus may further include a transceiver (not shown in the figure), configured to receive and/or send data. The communications apparatus in this embodiment of this application may be any device that has a wireless communication function, for example, an access point, a site, user equipment, or a base station.

In addition, the communications apparatus may further have double functions of encoding and decoding. When the communications apparatus is used as an encoder, the communications apparatus performs encoding operations, and when the communications apparatus is used as a decoder, the communications apparatus performs decoding operations. The communications apparatus includes a baseband chip. The baseband chip includes an encoder and a decoder. The encoder may be configured to implement functions the same as those of the foregoing encoder, and the decoder may implement functions the same as those of the foregoing decoder.

In the foregoing embodiments, the processor may be an integrated circuit that works according to a non-hardwired instruction or an integrated circuit that works according to a hardwired instruction. The processor that works according to the non-hardwired instruction reads and performs the instruction in the memory to implement the embodiments of any one of the data processing methods shown in FIG. 7 to FIG. 11, or implement the embodiments of any one of the data processing apparatuses shown in FIG. 12 to FIG. 16. The processor that works according to the hardwired instruction runs a hardware logic circuit of the processor to implement the embodiments of any one of the data processing methods shown in FIG. 7 to FIG. 11, or implement the embodiments of any one of the data processing apparatuses shown in FIG. 12 to FIG. 16. In a process of running the hardware logic circuit of the processor, the processor that works according to the hardwired instruction often needs to read some data from the memory, or output a running result to the memory. The memory is a random access memory (Random Access Memory, RAM for short), a flash memory, a read only memory (Read Only Memory, ROM for short), a programmable read only memory, an electrically erasable programmable memory, a cache (CACHE), a register, or a storage medium that is easy to be read by the processor.

In the foregoing embodiments, the processor may be a central processing unit (Central Processing Unit, CPU for short), a graphics processing unit (Graphics Processing Unit, GPU for short), a digital signal processor (Digital Signal Processor, DSP for short), and an application specific integrated circuit (Application Specific Integrated Circuit, ASIC for short), a field programmable gate array (Field Programmable Gate Array, FPGA for short), a network processor (Network Processor, NP for short), another programmable logic device, a discrete gate transistor logic device, or a discrete hardware component, and the like.

All or some of the foregoing embodiments may be implemented through software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a special-purpose computer, a computer network, or other programmable apparatuses. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a Solid State Disk (SSD)), or the like.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

The invention claimed is:

1. A data processing method, wherein the method comprises:
receiving, by an encoder, a to-be-encoded information block;
performing, by the encoder, polar encoding on the to-be-encoded information block;
outputting, by the encoder, a result of the encoding of the information block; and
when a channel coding parameter is in one value range, performing, by the encoder, a parity check on the information block before performing polar encoding, wherein,
the channel coding parameter comprises at least one of the following parameters: N, M, K, L, and a derived parameter determined by at least one of N, M, K, and L, wherein N indicates a mother code length of polar encoding, M indicates the code length, K indicates the length of the information block, and L indicates a search width in a decoding process.

2. The method according to claim 1, wherein the performing, by the encoder, polar encoding on the to-be-encoded information block comprises:
encoding, by the encoder, the information block in a PC-Polar encoding when channel coding parameters make true K/M<1/6.

3. The method according to claim 2, wherein K/M<1/12.

4. The method according to claim 1, wherein the performing, by the encoder, polar encoding on the to-be-encoded information block comprises:
encoding, by the encoder, the information block in a PC-Polar coding manner when a channel coding parameter K>48.

5. The method according to claim 4, wherein K meets at least one: K>64,
K>80,
and K>120.

6. The method according to claim 1, wherein the performing, by the encoder, polar encoding on the to-be-encoded information block comprises:
encoding, by the encoder, the information block in a CA-Polar encoding when channel coding parameters make true K/M>1/12.

7. The method according to claim 1, wherein the performing, by the encoder, polar encoding on the to-be-encoded information block comprises:
encoding, by the encoder, the information block in a CA-Polar encoding when a channel coding parameter K<120.

8. The method according to claim 7, wherein K meets at least one: K<80,
K<64,
and K<48.

9. A data processing method, wherein the method comprises:
receiving, by a decoder, a to-be-decoded data block;
performing, by the decoder, polar decoding on the to-be-decoded data block;
outputting, by the decoder, a result of the decoding of the data block; and
when a channel coding parameter is in one value range, performing, by the decoder, a parity check on the data block after performing polar decoding, wherein,
wherein the channel coding parameter comprises at least one of the following parameters: N, M, K, L, and a derived parameter determined by at least one of N, M, K, and L, wherein N indicates a mother code length of polar encoding, M indicates the code length, K indicates the length of the data block, and L indicates a search width in a decoding process.

10. The method according to claim 9, wherein performing, by the decoder, polar decoding on the to-be-decoded data block comprises:
decoding the data block in a PC-Polar decoding manner when channel coding parameters make true K/M<1/6.

11. The method according to claim 10, wherein K/M<1/12.

12. The method according to claim 9, wherein performing, by the decoder, polar decoding on the to-be-decoded data block comprises:
decoding the data block in a PC-Polar decoding manner when a channel coding parameter K>48.

13. The method according to claim 9, wherein K meets at least one: K>64,
K>80,
and K>120.

14. The method according to claim 9, wherein performing, by the decoder, polar decoding on the to-be-decoded data block comprises: decoding the data block in a CA-Polar decoding manner when channel coding parameters make true K/M>1/12.

15. The method according to claim 9, wherein performing, by the decoder, polar decoding on the to-be-decoded data block comprises: decoding the data block in a CA-Polar decoding manner when a channel coding parameter K<120.

16. The method according to claim 15, wherein K meets at least one: K<80,
K<64,
and K<48.

17. The method according to claim 9, wherein when the channel coding parameter is not in the value range, avoiding performing, by the decoder, the parity check on the data block after performing the polar encoding.

18. The method according to claim 9, further comprising:
performing, by the decoder, a cyclic redundancy check on the data block after performing the polar decoding.

19. A data processing apparatus, wherein the apparatus comprises:
an interface module, configured to receive a to-be-encoded information block; and
a first encoding module, configured to polar encode the information block wherein
the interface module is further configured to output a result of the encoding the information block,
when a channel coding parameter is in one value range, the first encoding module is configured to perform a parity check on the information block before the polar encoding, wherein,
the channel coding parameter comprises at least one of the following parameters: N, M, K, L, and a derived parameter determined by at least one of N, M, K, and L, wherein N indicates a mother code length of polar encoding, M indicates the code length, K indicates the length of an information block, and L indicates a search width in a decoding process.

20. The apparatus according to claim 19, wherein the first encoding module is further configured to encode, on the encoder, the information block in a PC-Polar encoding when the channel coding parameters make true K/M<1/6.

21. The apparatus according to claim 19, wherein the first encoding module is further configured to encode, on the encoder, the information block in a PC-Polar encoding when the channel coding parameter K>48.

22. The apparatus according to claim 19, wherein the first encoding module is further configured to encode, on the encoder, the information block in a CA-Polar encoding when the channel coding parameters make true K/M>1/12.

23. The apparatus according to claim 19, wherein the first encoding module is further configured to encode, on the encoder, the information block in a CA-Polar encoding when the channel coding parameter K<120.

24. A data processing apparatus, wherein the apparatus comprises:
a transceiver module, configured to receive a to-be-decoded data block; and
a second decoding module, configured to polar decode the data block, wherein
the transceiver module is further configured to output a result of the decoding the data block,
when a channel coding parameter is in one value range, the second decoding module is configured to perform a parity check on the data block after the polar decoding, wherein,
wherein the channel coding parameter comprises at least one of the following parameters: N, M, K, L, and a derived parameter determined by at least one of N, M, K, and L, wherein N indicates a mother code length of polar encoding, M indicates the code length, K indicates the length of the data block, and L indicates a search width in a decoding process.

25. The apparatus according to claim 24, wherein the second decoding module is further configured to decode the data block in a PC-Polar decoding manner when channel coding parameters make true K/M<1/6.

26. The apparatus according to claim 24, wherein the second decoding module is further configured to decode the data block in a PC-Polar decoding manner when a channel coding parameter K>48.

27. The apparatus according to claim 24, wherein the second decoding module is further configured to decode the data block in a CA-Polar decoding manner when channel coding parameters make true K/M>1/12.

28. The apparatus according to claim 24, wherein the second decoding module is further configured to decode the data block in a CA-Polar decoding manner when a channel coding parameter K<120.

29. An apparatus in a wireless communication network, comprising a processor and a memory storing program instructions for execution;
wherein when executed by the processor, the program instructions cause the apparatus to:
obtain a to-be-encoded information block;
perform polar encoding on the to-be-encoded information block;
output a result of the encoding of the information block; and
when a channel coding parameter is in one value range, perform a parity check on the information block before performing polar encoding, wherein,
the channel coding parameter comprises at least one of the following parameters: N, M, K, L, and a derived parameter determined by at least one of N, M, K, and L, wherein N indicates a mother code length of polar encoding, M indicates the code length, K indicates the length of an information block, and L indicates a search width in a decoding process.

30. The method according to claim 1, wherein when the channel coding parameter is not in the value range, avoiding performing, by the encoder, the parity check on the information block before performing the polar encoding.

31. The method according to claim 1, further comprising:
performing, by the encoder, a cyclic redundancy check on the information block before performing the polar coding.

* * * * *